(12) United States Patent
Reulet et al.

(10) Patent No.: US 11,714,146 B2
(45) Date of Patent: Aug. 1, 2023

(54) NUCLEAR MAGNETIC RESONANCE SPECTROMETER, METHOD OF OPERATION, AND PROBE THEREFORE

(71) Applicant: SOCPRA SCIENCES ET GENIE S.E.C., Sherbrooke (CA)

(72) Inventors: Bertrand Reulet, Sherbrooke (CA); Jeffrey A. Quilliam, Sherbrooke (CA); Mathieu Massicotte, Waterville (CA); Aimé Verrier, Sherbrooke (CA)

(73) Assignee: SOCPRA SCIENCES ET GENIE S.E.C., Sherbrooke (CA)

( * ) Notice: Subject to any disclaimer, the term of this patent is extended or adjusted under 35 U.S.C. 154(b) by 0 days.

(21) Appl. No.: 17/488,239

(22) Filed: Sep. 28, 2021

(65) Prior Publication Data
US 2022/0187393 A1    Jun. 16, 2022

Related U.S. Application Data

(60) Provisional application No. 63/084,627, filed on Sep. 29, 2020.

(51) Int. Cl.
*G01R 33/34*   (2006.01)
*G01R 33/46*   (2006.01)

(52) U.S. Cl.
CPC .  *G01R 33/34023* (2013.01); *G01R 33/34038* (2013.01); *G01R 33/46* (2013.01)

(58) Field of Classification Search
CPC .............. G01R 33/46; G01R 33/34023; G01R 33/34038
See application file for complete search history.

(56) References Cited

U.S. PATENT DOCUMENTS

| 5,565,778 | A | 10/1996 | Brey et al. | |
| 6,326,787 | B1 * | 12/2001 | Cowgill | G01R 33/341 |
| | | | | 324/318 |
| 6,420,871 | B1 * | 7/2002 | Wong | G01R 33/34046 |
| | | | | 324/318 |
| 6,556,013 | B2 | 4/2003 | Withers | |
| 9,103,889 | B1 * | 8/2015 | Fukushima | G01R 33/341 |

(Continued)

FOREIGN PATENT DOCUMENTS

EP    1600785    11/2005

OTHER PUBLICATIONS

Application of Surface Coil for Nulcear Magnetic Resonance Studies of Semi-conducting Thin Films. Wencong Liu. Physics Departement, Brown University, Providence, RI, USA. Oct. 19, 2017.

(Continued)

*Primary Examiner* — Dixomara Vargas
(74) *Attorney, Agent, or Firm* — Alexandre Daoust; Norton Rose Fulbright Canada LLP

(57) ABSTRACT

The nuclear magnetic resonance (NMR) system can have an interrogating subsystem comprising a superconducting path with an alternating plurality series of parallel back and forth segments collectively forming an interrogating surface adjacent the sample area, the interrogating subsystem configured for i) emitting an oscillating magnetic field B1 configured to disrupt a configuration of nuclear spins in the sample in a manner for the disrupted nuclear spins to generate a signal, and ii) receiving the signal.

22 Claims, 8 Drawing Sheets

(56) References Cited

U.S. PATENT DOCUMENTS

| | | | | |
|---|---|---|---|---|
| 2003/0193380 A1* | 10/2003 | de Swiet | .......... | G01R 33/34046 |
| | | | | 333/219 |
| 2005/0040823 A1* | 2/2005 | Blumich | ............ | G01R 33/3808 |
| | | | | 324/307 |
| 2006/0173284 A1* | 8/2006 | Ackerman | ....... | G01R 33/34084 |
| | | | | 600/422 |
| 2006/0244453 A1* | 11/2006 | Doty | ................... | G01R 33/3678 |
| | | | | 324/318 |
| 2007/0159170 A1* | 7/2007 | Freytag | ............ | G01R 33/34069 |
| | | | | 324/318 |
| 2008/0136416 A1* | 6/2008 | Goetz | .............. | G01R 33/34046 |
| | | | | 324/322 |
| 2013/0082709 A1* | 4/2013 | Rath | ................ | G01R 33/34076 |
| | | | | 324/322 |
| 2014/0218025 A1* | 8/2014 | Wong | ................. | G01R 33/3415 |
| | | | | 324/309 |

OTHER PUBLICATIONS

Application of surface coil in nuclear magnetic resonance studies of physical properties of quasi-2D materials. Wencong Liu. Physics Departement, Brown University, Providence, RI, USA. Nov. 27, 2017.

\* cited by examiner

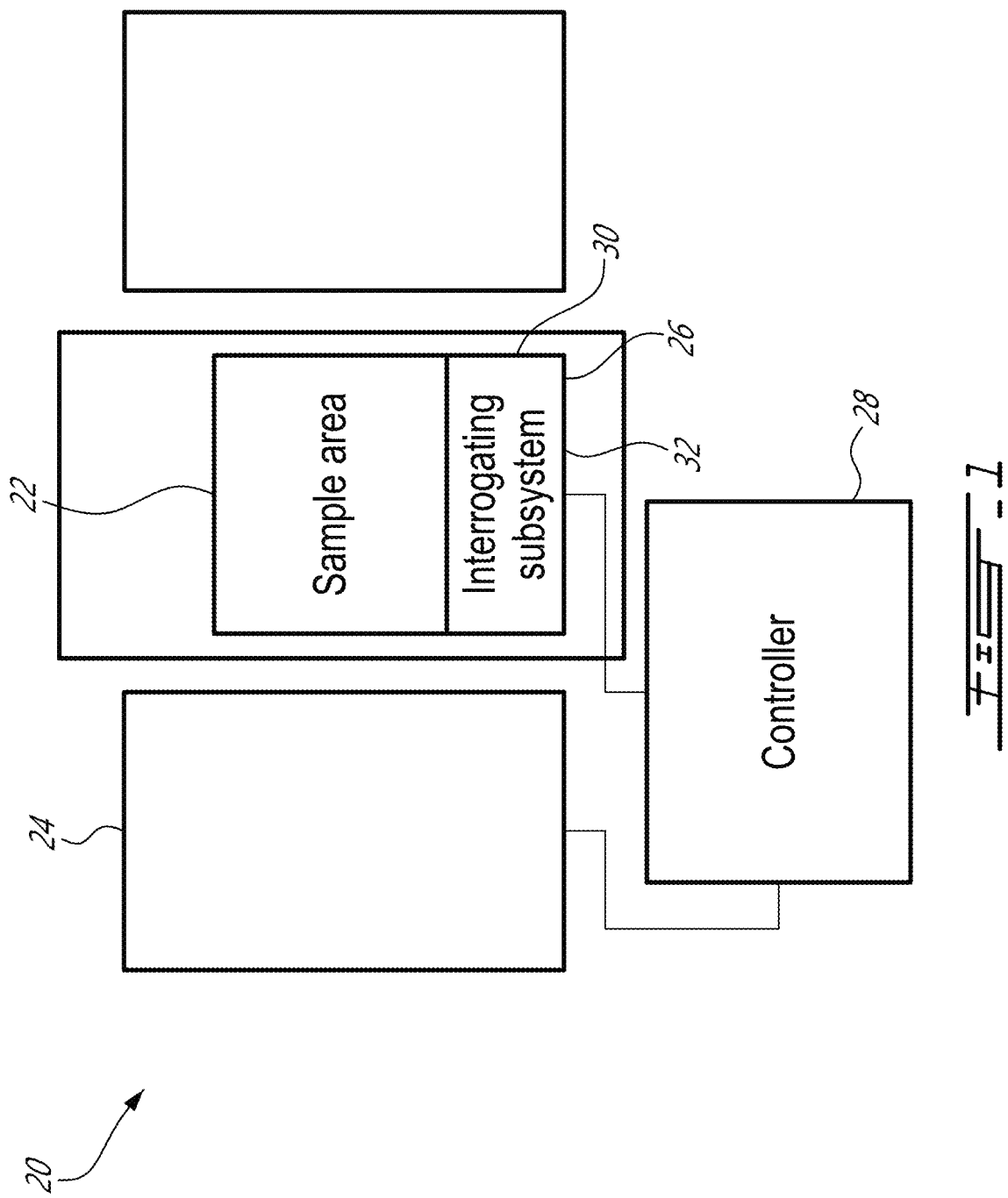

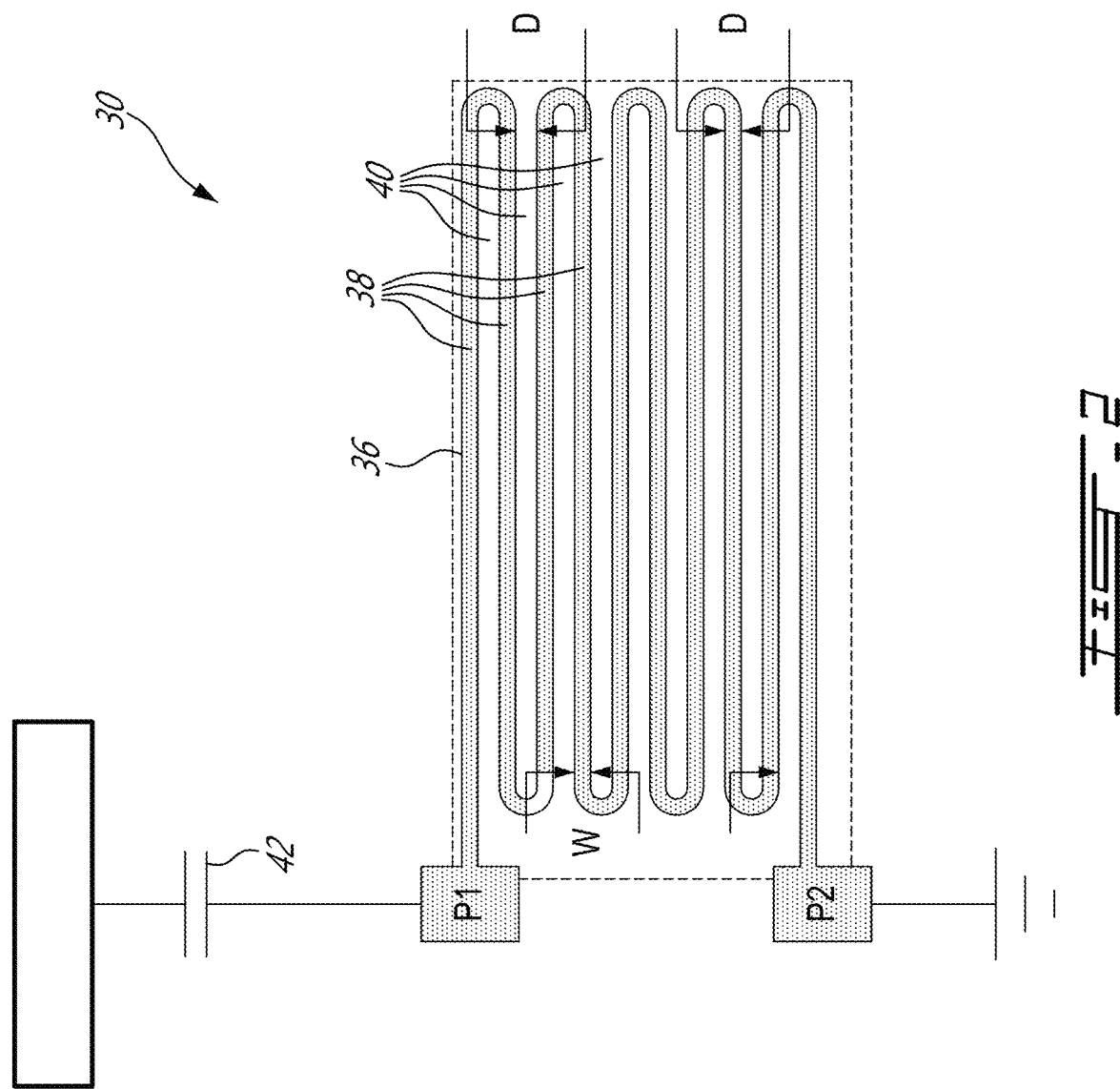

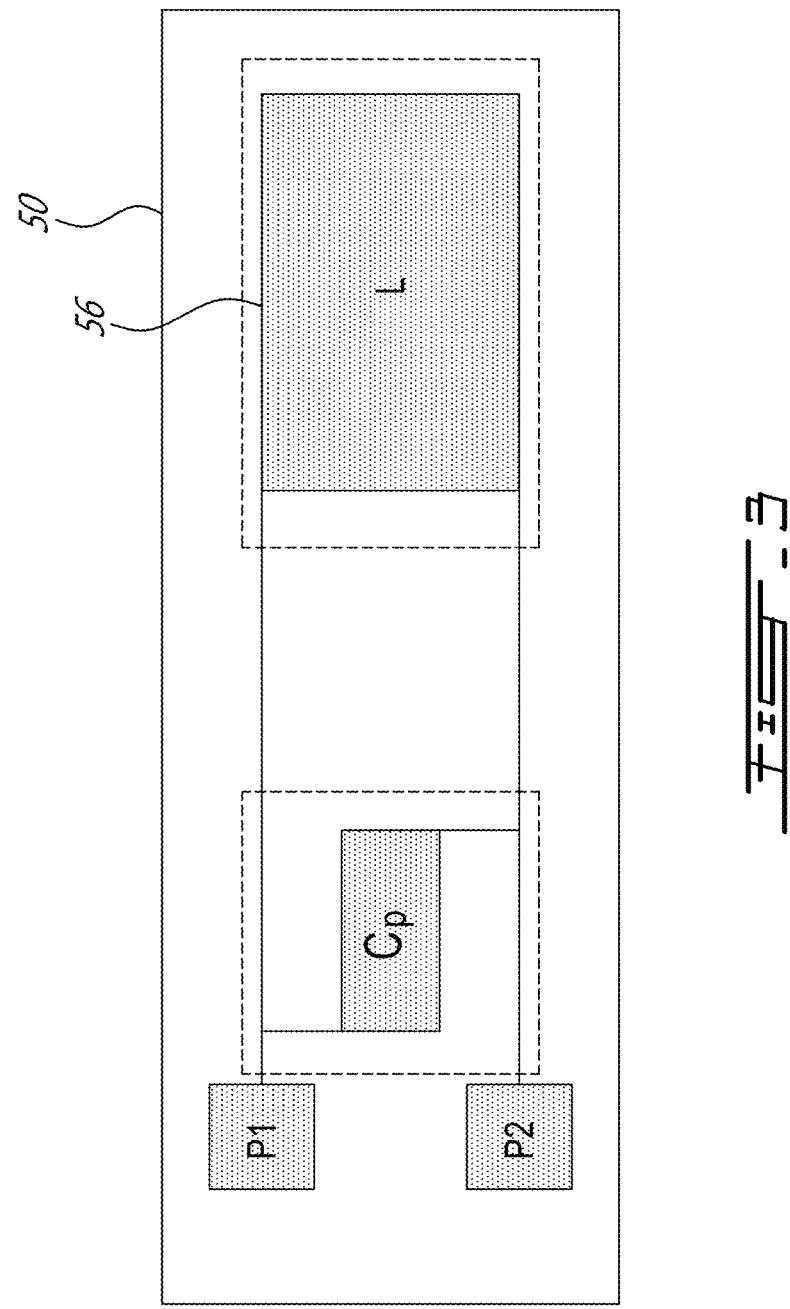

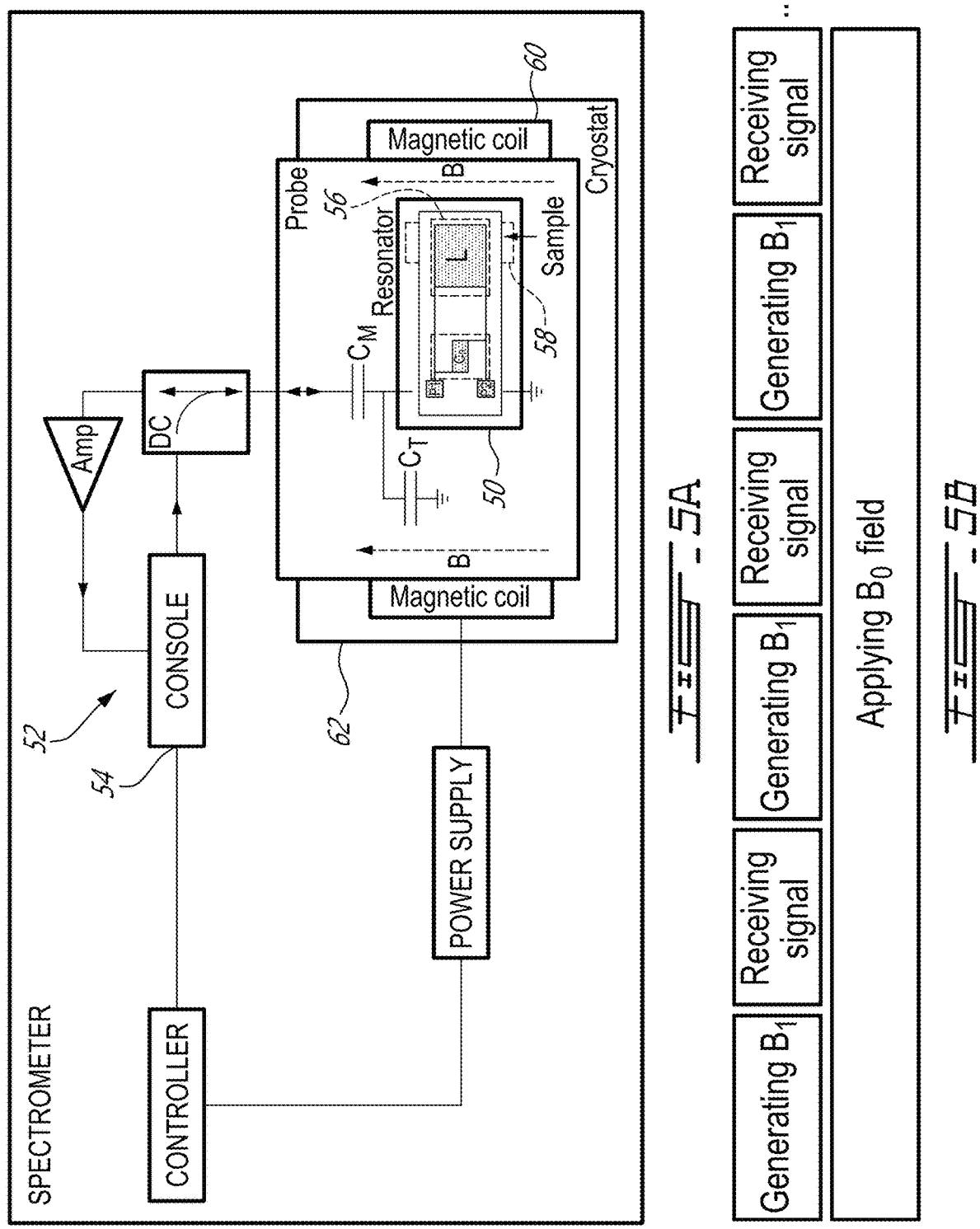

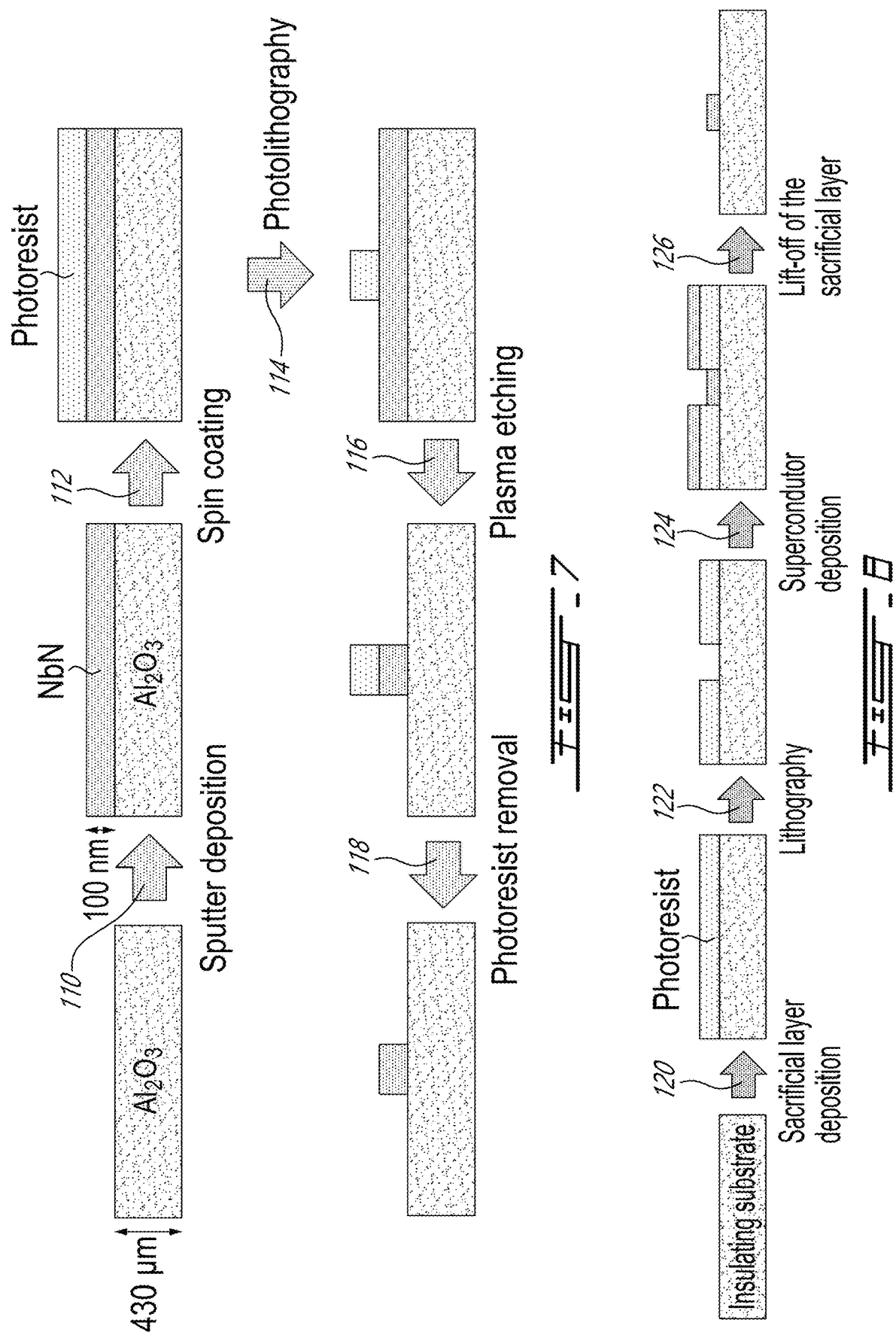

NUCLEAR MAGNETIC RESONANCE SPECTROMETER, METHOD OF OPERATION, AND PROBE THEREFORE

BACKGROUND

Nuclear magnetic resonance (NMR) is a technique which is used to observe local magnetic fields around atomic nuclei and is used in a wide variety of applications such as chemistry, physics and medicine. Its general mode of operation involves applying a static magnetic field, referred to herein as $B_0$, to magnetize non-zero spins of the atomic nuclei which are contained within the sample. Then, using an oscillating magnetic field referred to herein as $B_1$ at frequencies close to the Larmor frequency, in a different orientation (typically perpendicular to the first field where the sensitivity is the greatest), which can trigger precession of the nuclei. The precession generates a signal in the form of an oscillating magnetic field, the spectrum of which is characteristic of the nuclei in question. The signal is detectable by a suitable receiver. Typically, the time domain signal is received in the form of an oscillating voltage induced in a detection coil, digitized, and Fourier transformed in order to determine the frequency spectrum of the signal, using a spectrometer. It will be understood that other types of NMR techniques than the one discussed above exist, such as nuclear quadrupole resonance, for instance, but in all cases, some form of configuration of the spins is disrupted to generate the signal.

While the former techniques were satisfactory to a certain degree, there always remains room for improvement. Indeed, several factors may be sought by clients in a commercial NMR system, such as sensitivity and pricing for instance, and it is often useful to provide new options. Moreover, small samples, for instance, and especially very thin ones, can be difficult to characterize using former NMR spectroscopy techniques.

SUMMARY

Sensitivity can depend on several factors such as: coupling, tipping angle of nuclear spins (related to the strength of alternating field $B_1$), strength of static applied magnetic field ($B_0$), and quality factor.

The usual methodology of NMR measurements involves the application of an alternating field with a resonator in the form of an LC circuit where the inductor which generates the required rf magnetic field ($B_1$) has the form of a coil that surrounds the sample. Thin samples (e.g. under 1 µm thick), for instance, can be particularly challenging to analyze using this technique given the sensitivity achieved by earlier approaches. It was found that this drawback, for instance, could be alleviated by generating $B_1$ with a superconducting meander as the inductor.

In accordance with one aspect, there is provided a nuclear magnetic resonance (NMR) system for interrogating a sample in a sample area, the NMR system comprising: an interrogating subsystem comprising a superconducting path with an alternating series of parallel back and forth segments separated from one another by an insulating distance and collectively forming an interrogating surface adjacent the sample area, the interrogating subsystem configured for i) emitting an oscillating magnetic field $B_1$ disrupting a configuration of nuclear spins in the sample in a manner for the disrupted nuclear spins to generate a signal, and ii) receiving the signal; the interrogating subsystem configured to perform at least one of the emitting and the receiving via the superconducting path.

In accordance with another aspect, there is provided a method of capturing a nuclear magnetic resonance signal from a sample having a population of nuclear spins, the method comprising: emitting a time-varying magnetic field $B_1$ in the sample, thereby disrupting the configuration of at least some of the nuclear spins, the disrupted configuration nuclear spins generating the nuclear magnetic resonance signal in the form of an oscillating magnetic field; and receiving the nuclear magnetic resonance signal via a superconducting path including a plurality of parallel back and forth segments, the superconducting path positioned adjacent the sample.

In accordance with another aspect, there is provided a probe for a nuclear magnetic resonance (NMR) system, the probe comprising a superconducting path with a plurality of parallel back and forth segments separated from one another by an insulating distance and collectively forming an interrogating surface.

It will be understood that the expression "computer" as used herein is not to be interpreted in a limiting manner. It is rather used in a broad sense to generally refer to the combination of some form of one or more processing units and some form of memory system accessible by the processing unit(s). The memory system can be of the non-transitory type. The use of the expression "computer" in its singular form as used herein includes within its scope the combination of two or more computers working collaboratively to perform a given function. Moreover, the expression "computer" as used herein includes within its scope the use of partial capabilities of a given processing unit.

For instance, such as shown in FIG. 9, the computer 10 can have a processing unit 12 embodied in the form of a general-purpose micro-processor or microcontroller, a digital signal processing (DSP) processor, an integrated circuit, a field programmable gate array (FPGA), a reconfigurable processor, a programmable read-only memory (PROM), to name a few examples.

The memory system 14 can include a suitable combination of any suitable type of computer-readable memory located either internally, externally, and accessible by the processor in a wired or wireless manner, either directly or over a network such as the Internet. A computer-readable memory can be embodied in the form of random-access memory (RAM), read-only memory (ROM), compact disc read-only memory (CDROM), electro-optical memory, magneto-optical memory, erasable programmable read-only memory (EPROM), and electrically-erasable programmable read-only memory (EEPROM), Ferroelectric RAM (FRAM) to name a few examples.

A computer 10 can have one or more input/output (I/O) interface 16 to allow communication with a human user and/or with another computer via an associated input, output, or input/output device such as a keyboard, a mouse, a touchscreen, an antenna, a port, etc. Each I/O interface 16 can enable the computer to communicate and/or exchange data with other components, to access and connect to network resources, to serve applications, and/or perform other computing applications by connecting to a network (or multiple networks) capable of carrying data including the Internet, Ethernet, plain old telephone service (POTS) line, public switch telephone network (PSTN), integrated services digital network (ISDN), digital subscriber line (DSL), coaxial cable, fiber optics, satellite, mobile, wireless (e.g.

Wi-Fi, Bluetooth, WiMAX), SS7 signaling network, fixed line, local area network, wide area network, to name a few examples.

It will be understood that a computer can perform functions or processes via hardware or a combination of both hardware and software. For example, hardware can include logic gates included as part of a silicon chip of a processor. Software (e.g. application, process) can be in the form of data such as computer-readable instructions 18 stored in a non-transitory computer-readable memory accessible by one or more processing units. With respect to a computer or a processing unit, the expression "configured to" relates to the presence of hardware or a combination of hardware and software which is operable to perform the associated functions.

It will also be understood that the expression "superconducting" is used, for simplicity, somewhat as if it was an inherent property of the material in question, though it will be understood that all known superconducting materials at the time of drafting this specification only exhibited their superconducting property when they were below their critical temperature, within their critical current density and critical magnetic field. This typically requires some form of refrigeration, unless, for instance, the technique is used in outer space. The superconducting path can be made of a single superconducting material, or of a combination of superconducting materials.

Many further features and combinations thereof concerning the present improvements will appear to those skilled in the art following a reading of the instant disclosure.

DESCRIPTION OF THE FIGURES

In the figures,

FIG. 1 is a schematic view of an example of a nuclear magnetic resonance (NMR) system;

FIG. 2 is a schematic view of a probe for a NMR system, in accordance with a first embodiment;

FIG. 3 is a schematic view of another probe for a NMR system, in accordance with a second embodiment;

FIG. 5A is a schematic view of an example of a NMR system incorporating the probe of FIG. 3;

FIG. 5B presents an example method of operation of the NMR system of FIG. 5A;

FIG. 7 is a schematic view of a first example manufacturing process for a probe;

FIG. 8 is a schematic view of a second example manufacturing process for a probe.

DETAILED DESCRIPTION

Figure 4A:
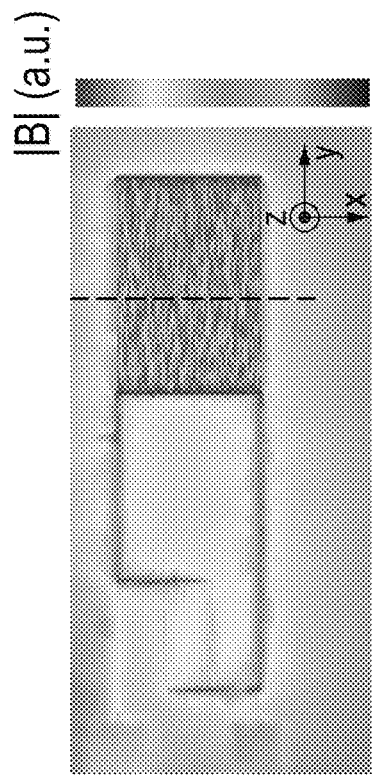
FIGS. 4A, 4B and 4C illustrate modeling results of the probe of FIG. 3.

FIG. 1 shows an example of a nuclear magnetic resonance (NMR) system 20 configured to interrogate a sample in a sample area 22. Generally, in this example, the NMR system includes a polarizing subsystem 24, an interrogating subsystem 26, and some form of controller 28. In one embodiment described in greater detail below, the sample area 22 and some relevant portions of the interrogating subsystem 26 are refrigerated. The polarizing subsystem 24 includes hardware elements configured to generate the $B_0$ static magnetic field across the sample area 22. The polarizing subsystem 24 can include a magnet, such as an electromagnet including a coil and a power source, for instance. The interrogation subsystem 26 includes hardware elements configured to emit the $B_1$ time-varying electro-magnetic field onto the sample which is configured to somewhat disrupt the nuclear spin alignment stemming from the $B_0$ field, such as via Larmor precession, to generate the signal. The hardware for generating the $B_1$ field can include a resonator associated to a probe 30, more details of an embodiment of which will be presented below, and some form of power source (not shown). The interrogation subsystem 26 also includes hardware elements configured to receive the signal and which can be referred to as a receiver 32. The receiver 32 can include a piece of hardware which can also be referred to herein as a probe, and some form of electronics, and typically software, configured to receive, analyze, and store the signal. The receiver probe and the emitter probe can be the same hardware component, or distinct hardware components. In practice, simplification of the apparatus can be achieved by using the same device for both the emission of the $B_1$, field and the reception of the signal, with any required hardware, but alternately, different hardware components can be used for these different functions if preferred for whatever reason. Accordingly, the receiver 32 can include a probe 26. The exact form of the controller 28, which can consist of distinct or combined elements for the respective control of the polarizing subsystem 24 and of the interrogating subsystem 26, can vary greatly depending on the embodiment. For instance, a spectrometer can be used which can include a controller, a console, a power source, and software can be provided on the controller (which can be a computer) to control both subsystems (an example of which will be discussed with reference to FIG. 5). In alternate embodiments, the controller or controllers can consist of simpler electronics, for instance. The controller or controllers can alternately be considered as forming part of the relevant subsystem(s).

In one embodiment, shown in FIG. 2, the probe 30 which receives the signal (and can also emit the $B_1$ field in this specific embodiment), has a superconducting path 36 with a plurality of parallel back and forth segments 38 each having a transversal width W, and separated from one another by insulating areas having a transversally oriented spacing distance D, generally forming what will be referred to herein as a meander line inductor, or simply "meander" for short. Collectively, one face of the different segments 38 of the superconducting path 36, which is adjacent the sample area, are all aligned with an imaginary surface which will be referred to herein as an interrogating surface for convenience. The superconducting path 36 can be driven by an alternating electrical current to generate the $B_1$ field. This can be done via two electrical connections P1, P2 located at opposite ends of the path, for instance. The electrical connections P1, P2 can be contact connections, such as conductive connections for instance, or contact-less, such as capacitive connections, for instance. Alternately, the superconducting path 36 can be used as a receiver. Still alternately, the superconducting path 36 can be used both for generating the $B_1$ field and as a receiver.

Such a superconducting path 36 can be produced by various techniques. As will be detailed further below, since the objective is typically to maximize the strength of the $B_1$ field within the existing constraints, one will typically wish to reduce the segment width and the spacing distance, and accordingly the use of micro-fabrication techniques may be suitable. Two examples of potentially suitable micro-fabrication techniques will be presented further below with reference to FIGS. 7 and 8.

One way to drive the superconducting path 36 is by using a resonator configuration. Indeed, the alternating orientation configuration of the segments 38 in the superconducting path possesses a non-negligible inductance. By adding a capacitor 42 in the circuit, one arrives at an electrical resonator configuration in the form of an LC circuit (that may be best modeled as a RLC circuit to take into account sources of dissipation). In the context where the superconducting segments 38 are in the form of a microstrip stripline, micro-fabricated onto an insulating substrate, the capacitor can alternately be provided in the form of an interdigitated capacitor also incorporated in the microstrip (stripline) construction, such as in the capacitor Cp of the embodiment presented in FIG. 3. However, alternately, the capacitor can be embodied elsewhere in the overall electrical circuit, e.g. outside the microstrip, such as the capacitor 42 in the embodiment of FIG. 2. Other means of driving the superconducting path with an alternating current or pulses than a resonator design can be used in other embodiments.

The field $B_1$ can be applied by sending a radiofrequency current pulse, a sequence of current pulses, such as by applying an alternating current in the superconducting path 36. The overall sensitivity of the NMR system using the superconducting path 36 having a meander inductor can depend on a number of factors, such as the degree of coupling to the sample (filling factor), the tipping angle of the disrupted nuclear spins (related to the strength of $B_1$), the strength of the static magnetic field ($B_0$), and the quality factor, which is related to the amount of dissipation in the electrical circuit.

A good filling factor for a very thin sample can be achieved by minimizing the space between wires in the meander, which is dependent both on the width of the segments, and the spacing distance between the segments. When reducing the width to a certain degree, the resistivity may rise undesirably, negatively affecting the quality factor, if the material is not exhibiting superconducting properties. Reaching both a satisfactory filling factor for a very thin sample and a satisfactory quality factor with a meander line inductor can be achievable via a superconducting conductive path.

Moreover, the more the inter-segment spacing is small, the more the magnetic field $B_1$ at its surface is intense. A period less than a few hundred micrometers in some embodiments, less than a few tens of micrometers in other embodiments, or inferior to a few micrometers in still other embodiments can produce a magnetic field sufficiently intense to tip the nuclear spins significantly and generate a detectable NMR signal in thin layer samples. The sensitivity of the meander line inductor in detecting the oscillatory magnetic field generated by the precession of nuclear spins in a thin sample is similarly maximized with a small inter-segment spacing and high quality factor. Using a planar geometry can be particularly well suited to planar samples, whereas other geometries may be preferred for corresponding sample geometries. It will be noted that conversely (due to reciprocity theorem), a good emitter can make a good receiver for the same reasons: high coupling factor and Q factor, and that accordingly, it can be preferable in some embodiments to use a same probe for both functions.

The density of the critical current can affect the choice of dimensions. For instance, if the critical current is very high, a small period can be preferred since it can increase the filling factor and allow better operability on thinner samples. If the current density is not very high, which can be the case with NbN for instance, it may be required to increase the size of the segments, and thus the period, to generate a sufficient current and magnetic field.

Production cost can also be a relevant consideration, and large-scale photolithography techniques can have a resolution on the order of the micron, and even lower. There are some smaller scale production techniques such as electrolithography which can reach resolutions in the order of 10 nm, but such dimensions may lead to other issues, such as increasing kinetic inductance above the geometrical inductance, which can ultimately negatively affect sensitivity. Accordingly, widths and spacings in the hundred-micrometer, ten-micrometer, or micrometer range may represent a suitable geometry for some embodiments.

A good tipping angle is also dependent on a relatively high current within the meander line which allows for the application of more intense pulses and thus the generation of more intense magnetic field intensities for $B_1$. At a given set of geometrical dimensions of width and spacing, the maximum current capacity (the critical current) can be increased by making the resonator thicker, or by using a material having a higher critical current density (Jc), since the critical current Ic is given by Ic=Jc*Width*Thickness. High critical temperature (Tc) superconductors typically have higher critical current densities than lower Tc superconductors, but the choice of the superconductor material may be influenced by a number of other factors, which will be presented below. The thickness is indirectly limited by the period of the meander. The smaller the period, the greater the out-of-plane confinement of the magnetic field is. For such considerations, it may be preferred to have a Width/Thickness ratio below 100 in some embodiments, below 30 in some embodiments, and in the order of 1 in some embodiments.

The strength of the applied static field ($B_0$) can also be limited by the type of superconductor chosen, as large magnetic fields tend to negate superconductivity. In general, Type II superconductors are able to sustain higher magnetic fields. Typically, the higher the transition temperature ($T_c$) the higher the magnetic field that can be applied. High-$T_c$ (cuprate) superconductors tolerate much higher fields than other types of superconductor which makes the advantageous for use in the present system. It will be noted that the effect of the magnetic field ($B_0$) can further be affected by its orientation relative to the sensing surface. For instance, in an embodiment where the plurality of back and forth segments lie in a plane, the maximum effect may be achieved by applying a magnetic field ($B_0$) normal to the plane. In the event where an angle θ exists between the orientation of the magnetic field and the plane, the signal strength can be proportional to cos(θ). The loss in signal strength may be negligible if the angle θ is small, but may quickly become significant if the angle is greater.

At the current state of technology, even high Tc superconductors are required to be below their critical temperature, and on planet Earth, at the time this specification was written, this still required cooling to a significant extent. Superconductors are considered High-Tc when their critical temperature is above 73.5 K (−200° C.). Some cuprates, in particular, have a Tc as high as 138 K. On one hand, higher Tc is typically better because higher Tc superconductors typically possess higher critical current density ($J_c$) and can tolerate higher external magnetic fields (have a larger critical field strength), are less demanding in terms of refrigerating power, and allow for the analysis of samples over a broader range of temperature. Indeed, given the fact that the sample is typically at the same temperature as the meander line inductor, the sample can be characterized at any temperature between the Tc and the minimum temperature of the refrigerator (cryostat). At higher temperatures, one could use liquid nitrogen to cool the resonator, which is easier and less expensive to produce than liquid helium. In a NMR system or method, the superconductor will be exposed to the static field $B_0$, which is preferably as strong as possible/practical. Some superconductor materials lose their superconducting properties when exposed to magnetic fields above a critical magnetic field strength. Some conventional superconductors, commonly referred to as type 1 superconductors, have a critical magnetic field strength of less than 1 T, which would be very restrictive in a NMR context. Type 2 superconductors, such as high Tc cuprates or NbN, can have a higher critical magnetic field strength and can be preferred for this reason. Many high Tc superconductors remain superconducting even at magnetic fields as high as 20 T or more (<1 T). However, some other factors can affect the choice of superconducting material. For instance, there can be challenges in making effective electrical connexions with Type 2 or High Tc superconductors, which may undesirably introduce resistance in the resonator and lower the quality factor. To a certain extent, such inconveniences may be alleviated by using contact-less connexions, such as via interdigitated tuning capacitors fabricated out of the same superconducting thin film or other capacitive connexions. There can also be challenges in finding suitable production techniques to build complex electrical paths with high Tc superconductors given, for instance, that they may tend to degrade during production steps such as due to exposure to heat.

There can exist a tradeoff concerning the choice of total length of the conductive path along the meander inductor. The longer the path, the greater the area of the meander, which can allow to process larger samples and achieve a better NMR signal. However, the longer the path, the greater the inductance, and the smaller the natural frequency of the resonator given the relationship $$\omega_0 = \frac{1}{\sqrt{LC}} \quad (1)$$

where $\omega_0$ is the natural frequency. When the resonator frequency is smaller, the static magnetic field $B_0$ must be smaller, which weakens the NMR signal. The designer may thus need to balance these factors as a function of the particularities of the specific application or embodiment. In some embodiments, it may be desired to keep the meander inductor's area within the square centimeter range, in other embodiments, it may be preferred to keep the meander inductor's area within the square millimetre range.

A very specific example is presented in FIG. 3 for the purpose of discussion. In this example, a superconducting circuit incorporating both an inductor L and a capacitor Cp is provided in the form of a 100 nm layer of NbN positioned on a 400 μm layer of $Al_2O_3$. The interdigitated capacitor $C_p$ has 5 μm wide segments interspaced by 5 μm, spanning 345>760 μm, and the meander inductor L has 3 μm wide segments interspaced by 3 μm, spanning 1000×1500 μm. The microstrip construction also includes two electrical contacts P1 and P2.

Figure 4C:
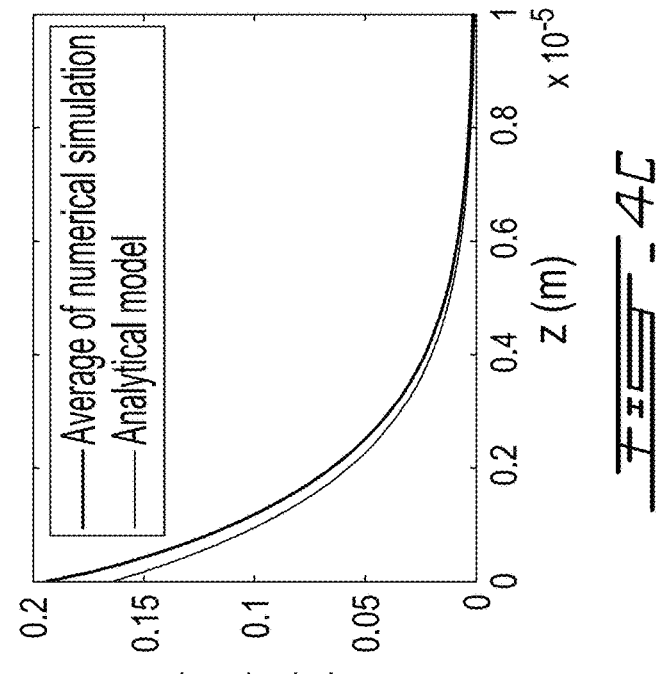
Figure 4B:
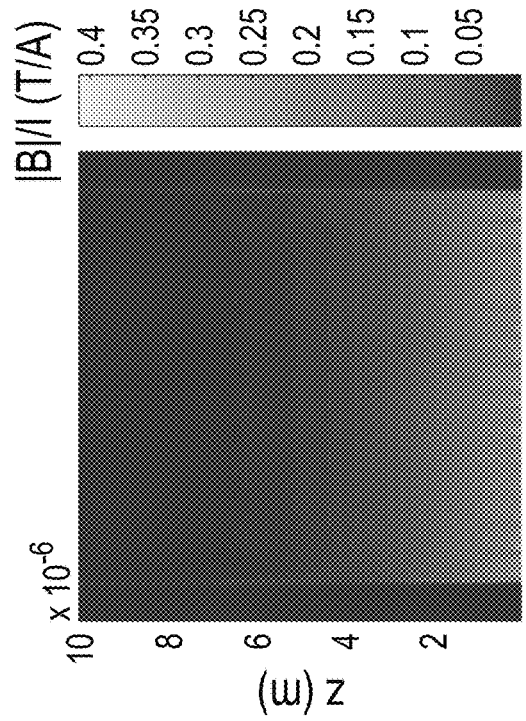

FIGS. 4A to 4C illustrate the $B_1$ field for an embodiment such as shown in FIG. 3, and wherein both the transversal width of the segments, and the spacing distance between the segments, are of 3 μm. More specifically, FIG. 4A presents a simulation of the intensity of the peak amplitude of the magnetic field $B_1$. FIG. 4B shows the intensity of the magnetic field divided by the electrical current I circulating within the path, calculated with the Biot-Savart law, and mapped within a Z-X plane coinciding with the dashed lined of FIG. 4A. FIG. 4C demonstrates the exponential decrease of the field as a function of the distance z above the interrogating surface. The numerical simulation in accordance with FIG. 4B matches quite well with the equation $$\frac{|B|}{I} = \frac{\mu_0 \pi}{2a} \exp(-2\pi z/a), \text{où} \mu_0 \quad (2)$$

where $\mu_0$ and a represent vacuum permeability and the period of the segments, respectively. In this context, it will be understood that positioning the sample very close to the plane of the meander line inductor will typically lead to a significantly stronger signal for a thin sample.

FIG. 5A presents an example system where a resonator 50 such as presented in FIG. 3 is incorporated with other hardware of a NMR system 52, namely a spectrometer 54 which is used both to drive the probe 56 to emit the field $B_1$, and to process the signal received via the antenna (which is also the probe 56 in this case). More specifically, the spectrometer 54 can generate a pulse $T_x$ which is transmitted to the resonator 50 via a directional coupler (DC) and two variable capacitors ($C_M$ and $C_T$) which can adjust the resonant frequency and adapt the impedance of the resonator 50 to the characteristic impendence of the cables. The sample 58 is positioned immediately adjacent (e.g. laid on top of) of the probe 56. The probe 56 and the sample 58 are exposed to a static field $B_0$ generated by a coil 60, and is maintained at a low temperature with a refrigerator 62 (cryostat). The signal is amplified at the exit of the directional coupler and is detected and processed by the console 54.

It will be noted that different naming conventions can be used to refer to different portions of the system in various embodiments, and that one was retained herewith not from the point of view of narrowly defining the relevant components, but for the sake of ease of reference and simplicity, in accordance with what was perceived the most common at the time of writing this specification. Indeed, the electronic apparatus that generates and digitizes the pulses can be referred to as the "console", and typically includes a computer, and a separate computer is typically used as a controller to control not only the console, but also the magnet. The controller can also be used to visualize and analyse the data. The expression "spectrometer" can be used to refer to the whole system, including magnet, electronics, probe, controller, console . . . . Other naming conventions can be used in other embodiments.

The system can be controlled in a manner to perform pulsed NMR, that is with an alternating sequence of $B_1$ field generation and signal reception while the $B_0$ field is continuously applied, for instance, as illustrated in the timeline from left to right which is presented in FIG. 5B.

Figure 6B:
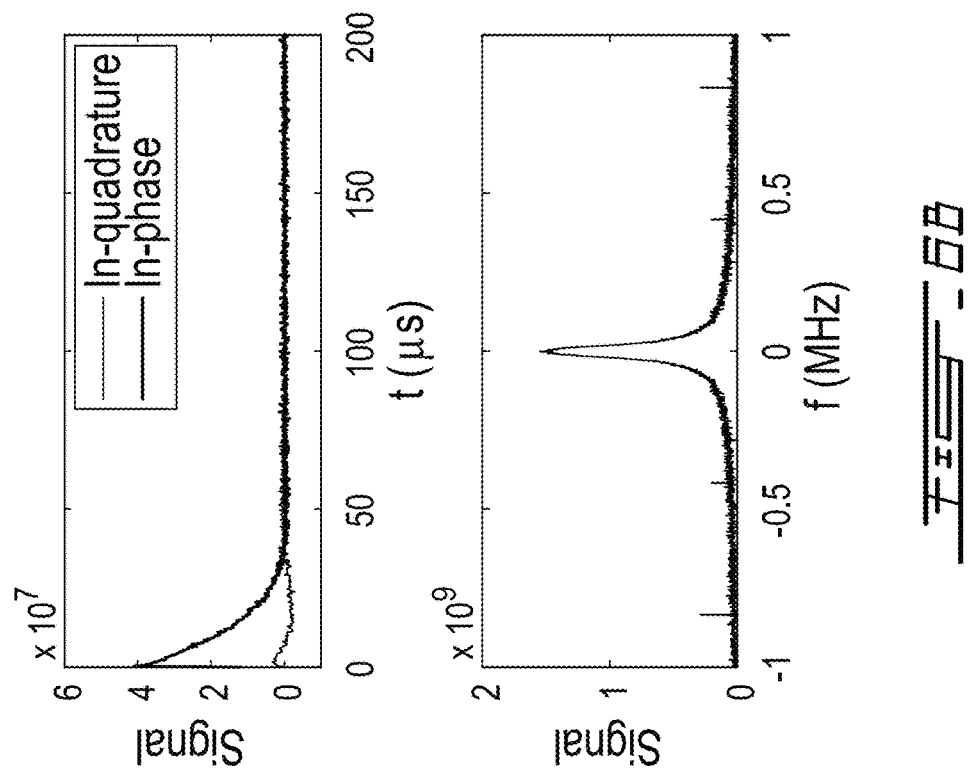
FIG. 6A is a schematic view showing a layer of boron applied to the probe of FIG. 3, and FIG. 6B are graphs presenting the results of the characterization of the layer of boron via a NMR method using the probe.
Figure 6A:
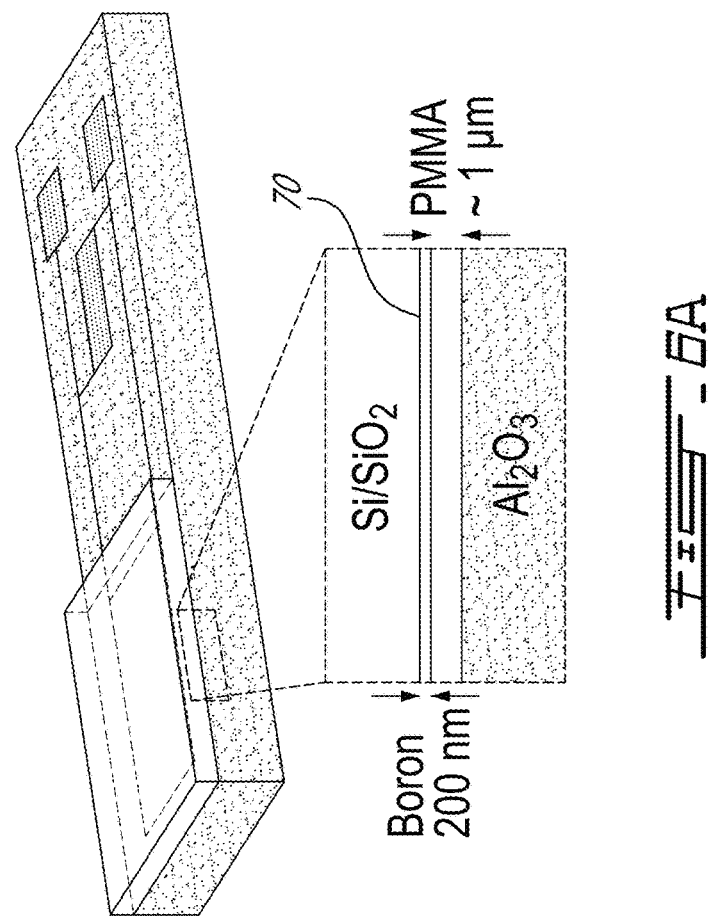
Figure 9:
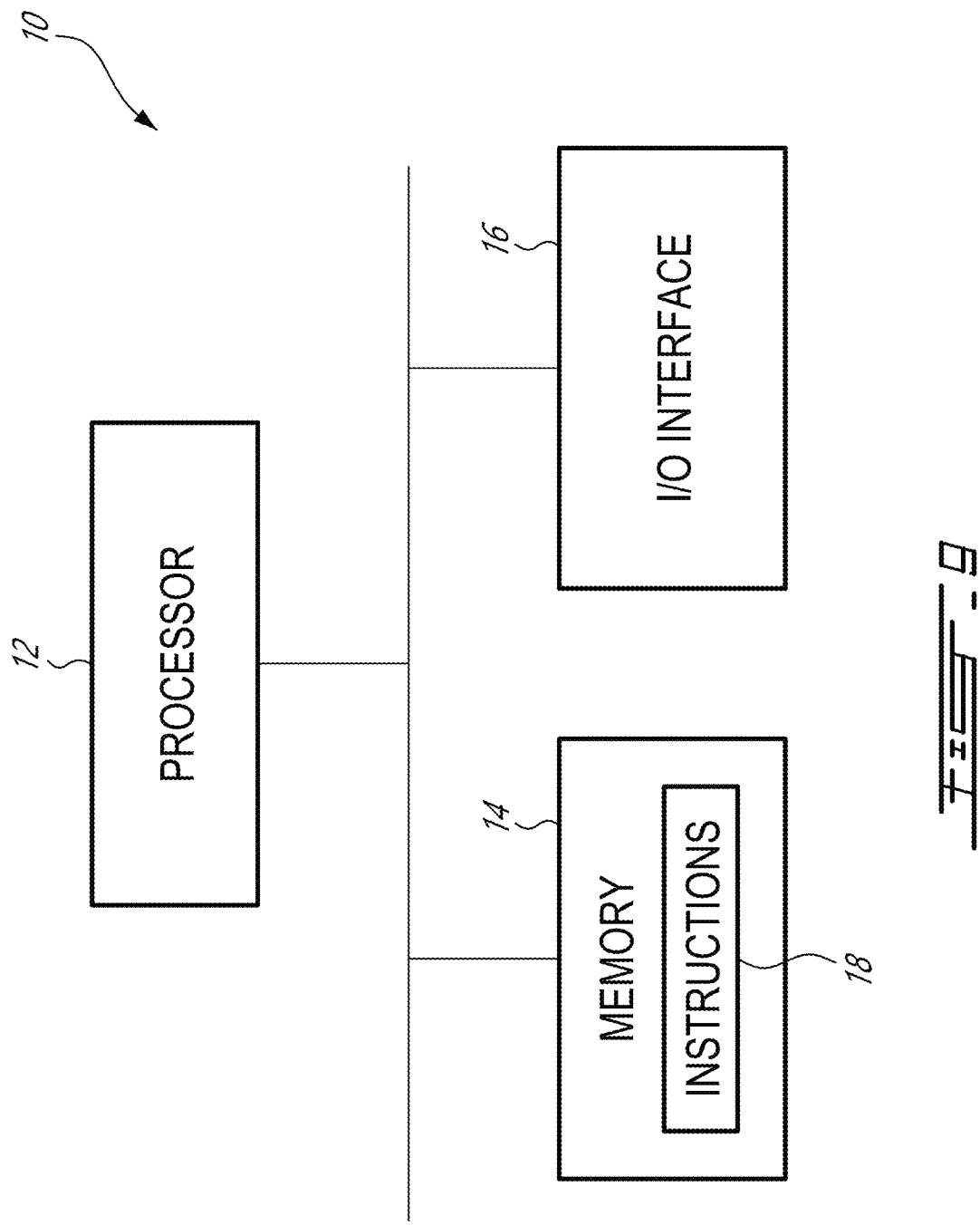
FIG. 9 is a schematic view of an example computer.

Experimental results have demonstrated that a thin coat of boron can be characterized using such a setup. As shown in FIG. 6A, a thin 200 nm layer of boron 70 can be adhered to the interrogating surface of the meander inductor by a layer of polymethyl-methacrylate (PMMA), which can be in the order of 1 um, for instance. The layer of boron itself can be produced by cathodic pulverisation on a substrate of Si/SiO2, for instance. The graph presented at FIG. 6B presents the NMR signal of free induction decay obtained by averaging 3 million sequences of impulse and detection, with a total averaging time of 3.3 h, allowing for a signal to noise ratio of 83. In this particular example application, the frequency of the pulses was 51.893 MHz and the sample was subjected to a 3.8025 T magnetic field $B_0$ and maintained, with the meander line inductor, at a temperature of 4.18 K. This experiment demonstrated that it was possible to detect the NMR signal in a thin layer of boron having roughly $1 \times 10^{-12}$ m$^3$ (1 nL) whereas it can be difficult to reach an active volume of any less than $1 \times 10^{-9}$ m$^3$ (1 uL) by more conventional methods. Accordingly, such a sensor can be particularly interesting to use to characterize new 2D materials such as graphene, black phosphorous, $RuCl_3$, thin superconducting layers and semiconducting heterostructures (III-V, oxides) to name a few examples.

FIG. 7 presents a first potential method of manufacturing the superconducting path. This example method involves pulverizing 110 the superconducting material onto a layer of an insulating substrate, applying 112 a layer of photoresin on top by centrifugal induction, removing 114 the photoresin outside the path by photolithography, removing 116 the portions of superconducting material which are outside the path by plasma engraving, and then dissolving 118 the remaining photoresin. It will be noted that although this process can be used to manufacture a specific probe with NbN on Al2O3, it can be used for manufacturing other superconductors on other substrates. Moreover, other forms of lithography or patterning than photolithography can be applied in alternate embodiments. FIG. 8 presents yet another potential method of manufacturing the superconducting path. In accordance with this other example method, a sacrificial coating is applied 120 onto an insulating substrate, the path is engraved 122 by removing portions of the sacrificial coat via lithography, the superconducting material is coated 124 on top, all of which is followed by a lift off step 126 where the unremoved portions of the sacrificial coat are removed together with the unnecessary portions of the superconductor, leaving only the superconducting path. The sacrificial coat can be a photoresin, for instance.

As can be understood, the examples described above and illustrated are intended to be exemplary only.

It will be noted for instance that in some cases, nuclear spin resonance can be achieved without the application of an external magnetic field. In materials which have magnetic order (for example ferromagnetism or antiferromagnetism), the electronic spins generate an internal magnetic field at the position of the nuclear spins. In some of these materials the strength of this internal magnetic field polarizes the nuclear spins sufficiently for magnetic resonance to be observed. In such a context, radiofrequency magnetic pulses (B1 field) may be used to disrupt the spins' alignment and induce spin precession which leads to a measurable signal. In other cases, when the nuclear spins have a value larger than ½, they also have a nuclear quadrupole moment. Depending on the crystal structure in which the nuclear spins are embedded, the nuclear quadrupole moment can interact with an internal electric field gradient. This gives rise to a splitting of energy levels. If the electric field gradient and the nuclear quadrupole moment are large enough, this energy splitting can allow for spin resonance to be observed, once again assuming that appropriate radiofrequency pulses are applied to the sample. This second phenomenon is known as nuclear quadrupole resonance (NQR). These two phenomena could be observed without the use of an external magnetic field (the polarizing subsystem) by using our invention to apply pulses and receive the signal. The size of rf pulses and the size of the resulting signal can be comparable to the conventional technique of NMR where an external magnetic field is applied. In still other cases, it can be preferable to perform optical pumping with circularly polarized light to create magnetization of the spins.

It will also be noted that in some cases, averaging of the signal can be done without a computer, such as with an analog oscilloscope or the signal can be large enough that no averaging is required.

It will be noted, moreover, that in practice, only a portion of nuclear spins is aligned, typically in the order of a part per million, which can be enough to achieve a suitable signal.

Also, while there can be challenges to using different probes for emission and reception, such challenges may be overcome by techniques such as depositing two resonators on top of one another and the use of one as transmitter and the other as receiver.

Accordingly, the scope is indicated by the appended claims.

What is claimed is:

1. A nuclear magnetic resonance (NMR) system for interrogating a sample in a sample area, the NMR system comprising:
    an interrogating subsystem comprising a superconducting path with an alternating series of parallel back and forth segments separated from one another by an insulating distance and collectively forming an interrogating surface adjacent the sample area, the parallel back and forth segments having a period less than a few hundred micrometers, the interrogating subsystem configured for
        i) emitting an oscillating magnetic field $B_1$ disrupting a configuration of nuclear spins in the sample in a manner for the disrupted nuclear spins to generate a signal, and
        ii) receiving the signal;
    the interrogating subsystem configured to perform at least one of the emitting and the receiving via the superconducting path.

2. The NMR system of claim 1 further comprising a polarizing subsystem configured to align nuclear spins of the sample.

3. The NMR system of claim 2 wherein the polarizing subsystem includes a magnet configured to generate a magnetic field $B_0$ in the sample area; and wherein the oscillating magnetic field $B_1$ is configured to disrupt the alignment of the nuclear spins.

4. The NMR system of claim 1 wherein the plurality of back and forth segments form an meander line inductor, and are electrically connected to a capacitor in an electrical resonator configuration.

5. The NMR system of claim 1 further comprising a computer including a processor and a non-transitory memory, the memory including computer readable instructions which, when executed by the processor, causes the computer to control the interrogating subsystem in an alternating sequence of said emitting and of said receiving, wherein during the emitting, the oscillating magnetic field $B_1$ is emitted, and during the receiving, the signal is received.

6. The NMR system of claim 1 wherein the interrogating subsystem forms part of a spectrometer.

7. The NMR system of claim 1 wherein the superconducting path is a stripline of a superconducting material covering an insulating substrate.

8. The NMR system of claim 7 wherein the superconducting path further comprises a plurality of interdigitated segments forming a capacitor, the capacitor forming an LC circuit with the plurality of parallel back and forth segments.

9. The NMR system of claim 7 wherein the superconducting path further comprises capacitive connexions.

10. The NMR system of claim 1 wherein the plurality of back and forth segments span a surface area in the square millimeter order of magnitude.

11. The NMR system of claim 1 wherein the plurality of back and forth segments lie in a common plane and are interconnected to one another at alternating ends.

12. The NMR system of claim 1 wherein the insulating distance is of a few micrometers.

13. The NMR system of claim 1 wherein the transversal width of the segments are of between 0.7 and 1.3 times the insulating distance.

14. The NMR system of claim 1 wherein the segments have a transversal width/thickness ratio of between 0.5 and 10, preferably between 0.7 and 5.

15. The NMR system of claim 1 wherein the superconducting path is made of a superconducting material having a critical temperature above 73.5 K.

16. The NMR system of claim 1 wherein the interrogating subsystem is configured to perform the receiving via the superconducting path.

17. The NMR system of claim 1 wherein the interrogating subsystem is configured to perform both the receiving and the emitting via the superconducting path.

18. A method of capturing a nuclear magnetic resonance signal from a sample having a population of nuclear spins, the method comprising:

emitting a time-varying magnetic field $B_1$ in the sample, thereby disrupting the configuration of at least some of the nuclear spins, the disrupted configuration nuclear spins generating the nuclear magnetic resonance signal in the form of an oscillating magnetic field; receiving the nuclear magnetic resonance signal via a superconducting path including a plurality of parallel back and forth segments having a period less than a few hundred micrometers, the superconducting path positioned adjacent the sample; and processing the nuclear magnetic resonance signal by a console, including digitizing the nuclear magnetic resonance signal.

19. The method of claim 18 further comprising generating a static magnetic field $B_0$ in the sample, thereby aligning the nuclear spins in the sample; the field $B_1$ being oblique or transversal relative to the field $B_0$, and disrupting the alignment of the nuclear spins.

20. The method of claim 19 wherein said emitting the field $B_1$ includes circulating an electrical current pulse in the superconducting path.

21. The method of claim 18 wherein said emitting the field $B_1$ includes forming an electrical resonance between the plurality of back and forth segments and a capacitor.

22. The method of claim 18 comprising repeating the steps of emitting and receiving alternatingly a plurality of times.

* * * * *